United States Patent
Choi et al.

[19]

[11] Patent Number: 6,085,804
[45] Date of Patent: Jul. 11, 2000

[54] APPARATUS AND METHOD FOR FORMING LEADS AND REMOVING TIN DUST FROM LEADS

[75] Inventors: Jun Hyuk Choi; Tai Kew Choi; Gyu Han Bae; Byong Do Na, all of Chungcheongnam-do, Rep. of Korea

[73] Assignee: Samsung Electronics Co., Ltd., Rep. of Korea

[21] Appl. No.: 09/223,048

[22] Filed: Dec. 30, 1998

[30] Foreign Application Priority Data

Jan. 15, 1998 [KR] Rep. of Korea ............... 98-1069

[51] Int. Cl.[7] .................................................. B21F 45/00
[52] U.S. Cl. ......................................... 140/105; 72/40
[58] Field of Search ........................ 29/743; 72/40; 140/105, 147

[56] References Cited

U.S. PATENT DOCUMENTS 3,001,280  9/1961  Lyon ......................................... 72/40
4,829,669  5/1989  Nakajima ................................ 140/105

FOREIGN PATENT DOCUMENTS 4063468  2/1992  Japan .

Primary Examiner—Lowell A. Larson
Attorney, Agent, or Firm—Skjerven, Morrill, MacPherson, Franklin & Friel LLP; David T. Millers

[57] ABSTRACT

A lead forming apparatus and a method for removing tin dust from the surface of the outer leads of semiconductor package are disclosed. The apparatus, in which a brushing operation removes tin dust from the outer leads, includes a supplier part; a lead forming part; a collection part; an intermediate post; a package transportation part; a brush block; and a brush transportation part. The method includes steps of providing a leadframe, forming the package leads, removing tin dust from the leads, and collecting the packages in a container.

19 Claims, 12 Drawing Sheets

APPARATUS AND METHOD FOR FORMING LEADS AND REMOVING TIN DUST FROM LEADS

BACKGROUND OF THE INVENTION

1. Field of the Invention

The present invention relates to a semiconductor package assembly apparatus and method and to a lead forming apparatus and method that removes tin dust from the surface of leads.

2. Description of the Related Art

A typical process for manufacturing a semiconductor package includes: die bonding which attaches a semiconductor chip (a die) to a die pad of a leadframe; wire bonding which connects bonding wires between bonding pads of the semiconductor chip and inner leads of a leadframe; molding which encapsulates the assembled body in an encapsulant, such as an epoxy molding compound; lead plating which performs tin-plating on outer leads of the leadframe to improve the weldability of the outer leads; trimming which cuts dam-bars of the leadframe and removes flash; and lead forming which bends and forms leads to a desired shape.

A conventional lead forming apparatus and method will be described with reference to FIG. 1 and FIG. 2, each of which shows the construction of a conventional lead forming apparatus. Referring to FIG. 1, a lead forming apparatus 100 includes: a supplier part 10 which supplies to apparatus 100 a leadframe 12 having multiple semiconductor packages thereon; a lead forming part 20 which bends the outer leads of semiconductor packages and separates the packages; a collection part 30 which collects the packages; and a package transportation part 40 for transporting the packages from lead forming part 20 to collection part 30. Lead forming part 20 includes a lead cutting die 22, a lead bending die 24, a lead forming die 26, and a tie-bar cutting die 28.

FIG. 2 shows a lead forming apparatus 200 which includes an intermediate post 150. Lead forming apparatus 200 includes: a supplier part 110 which supplies a leadframe 112 having multiple semiconductor packages thereon; a lead forming part 120 which bends the outer leads of the semiconductor packages and separates the packages; a collection part 130 which collects the packages; intermediate post 150 located between lead forming part 120 and collection part 130; and a package transportation part 140 for transporting the packages from lead forming part 120 to collection part 130. Lead forming part 120 includes a lead cutting die 122, a lead bending die 124, a lead forming die 126, and a tie-bar cutting die 128. Package transportation part 140 includes a first package transportation part 142 for transporting packages from lead forming part 120 to intermediate post 150, and a second package transportation part 146 for transporting packages from intermediate post 150 to collection part 130. Intermediate post 150 shortens the longest traveling distance of the packages by providing a temporary stay to the packages. Alternatively, when package transportation part 40 in FIG. 1 travels a long distance from lead forming part 20 to collection part 30, the packages have a greater chance of being dropped and damaged.

FIGS. 3A to 3D illustrate a conventional lead forming process. In FIG. 3A, a leadframe 300 having semiconductor packages 210 thereon is supplied to a lead forming apparatus. Then, a lead cutting die of the lead forming apparatus cuts outer leads 220 as shown in FIG. 3B. Thereafter, a lead bending die bends outer leads 220, and a lead forming die forms outer leads 220 to a desired shape as illustrated in FIG. 3C. Finally, a tie-bar cutting die cuts tie bars 230 connecting packages 210 to leadframe 300 and separates packages 210 from leadframe 300 to leave individualized semiconductor packages 250 as in FIG. 3D.

As mentioned earlier, the outer leads of semiconductor packages are plated with tin (Sn) or lead-tin (Pb—Sn) alloys. Friction between lead forming dies and the outer leads during the lead forming process can partially strip off the tin layer plated on the outer leads and produce "tin dust" that may adhere to the surface of the dies or the leads. As used herein, "tin dust" is not restrict to tin but may be any conductive dust or shavings. Depending on its size, tin dust attached to a lead is commonly called a tin burr or a tin short. FIG. 4A shows a tin burr 260, and FIG. 4B shows a tin short 270. Generally, tin burr 260 is tin dust having a length greater than a cut-off value, and tin short 270 is tin dust having a length greater than one half of lead pitch A.

Since the tin dust may give rise to an electrical short between the outer leads, after completing the lead forming process, all packages are examined with human eyes to find tin dust. Furthermore, a lead forming apparatus is periodically cleaned to remove the tin dust remaining in the apparatus. Both the postforming inspection and the cleaning reduce the productivity of equipment and processes forming semiconductor devices.

SUMMARY OF THE INVENTION

The present invention provides a lead forming apparatus and method for removing tin dust from the surface of the outer leads of semiconductor packages.

In accordance with an embodiment of the invention, a lead forming apparatus includes: a supplier part for providing a leadframe having semiconductor packages integrated thereon; a lead forming part for forming the outer leads of the packages and separating the packages from the leadframe; a collection part for collecting the separated packages; an intermediate post located between the lead forming part and the collection part; a package transportation part for transporting packages from the lead forming part to the collection part; and a brush block. The brush block includes one or more brushes located around the intermediate post, and the brushes remove tin dust that may remain on the outer leads from the lead forming process. The brush block further includes a brush transportation part which moves the brushes to and from the intermediate post.

In accordance with another aspect of the invention, a lead forming method includes: providing a leadframe having multiple packages integrated thereon; bending and forming the outer leads of the packages; separating the packages from the leadframe, and using an automated brush block to remove tin dust from the outer leads of the packages. The packages can then be collected in a container.

BRIEF DESCRIPTION OF THE DRAWINGS

The objects, features, and advantages of the present invention will be apparent to one skilled in the art in light of the following detailed description, in which.

DETAILED DESCRIPTION OF THE PREFERRED EMBODIMENT

Figure 1:
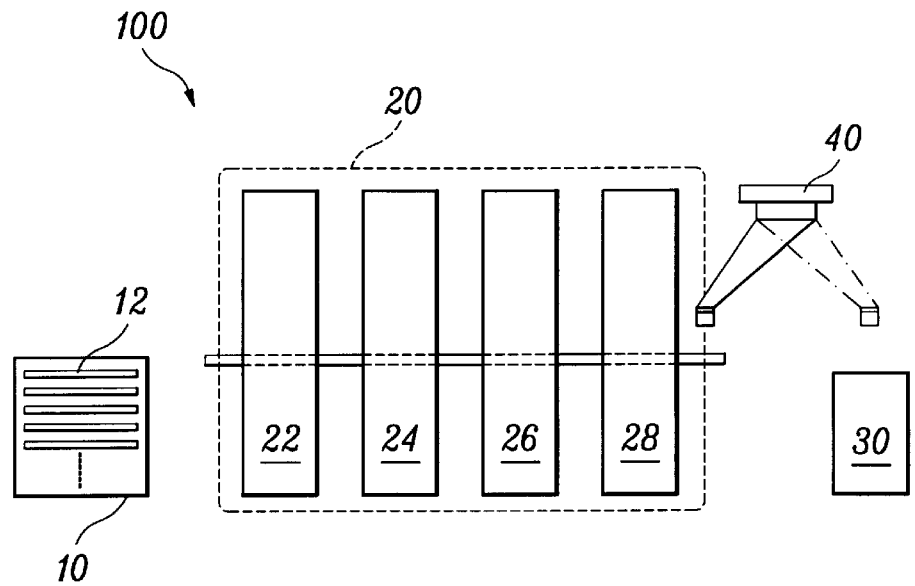
FIG. 1 shows a conventional lead forming apparatus.
Figure 2:
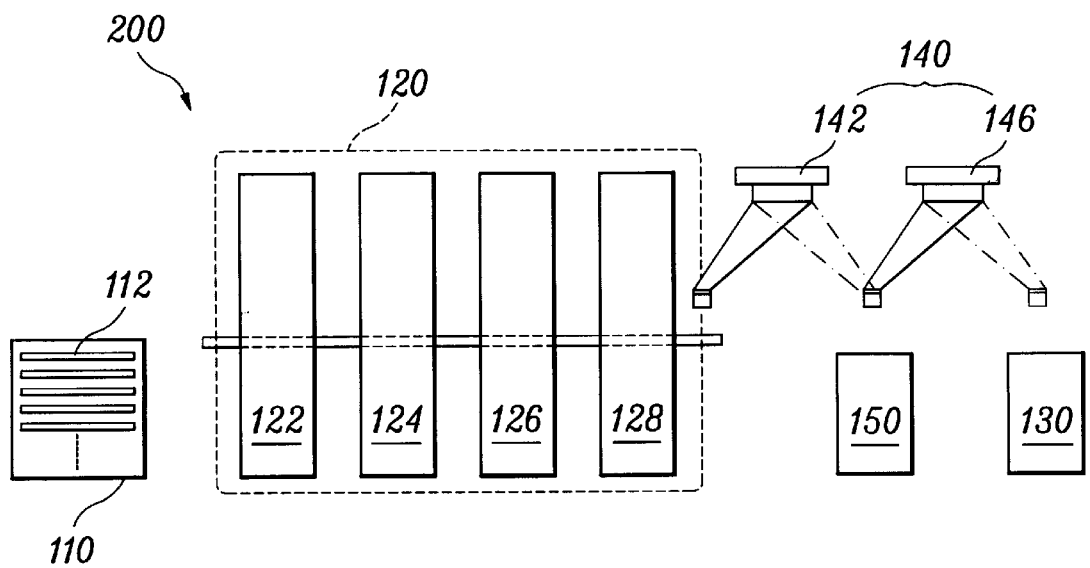
FIG. 2 shows another conventional lead forming apparatus.
Figure 3A:
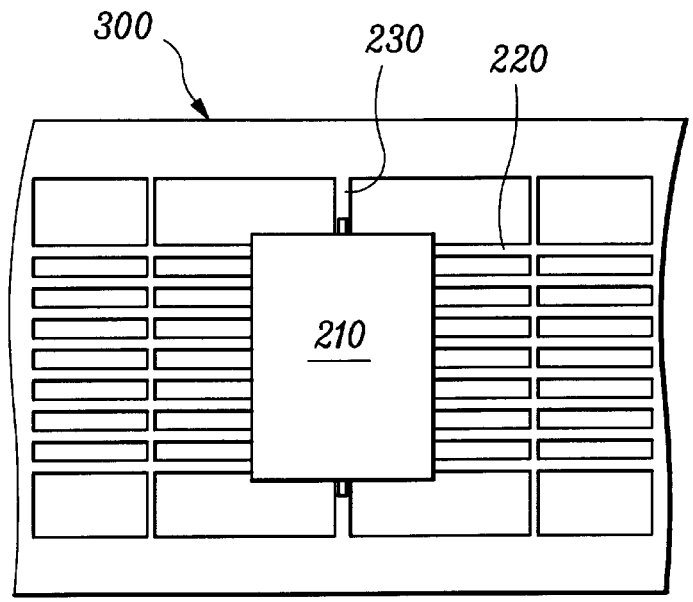
FIGS. 3A to 3D are plan views sequentially showing the progress of forming outer leads of a package.
Figure 3B:
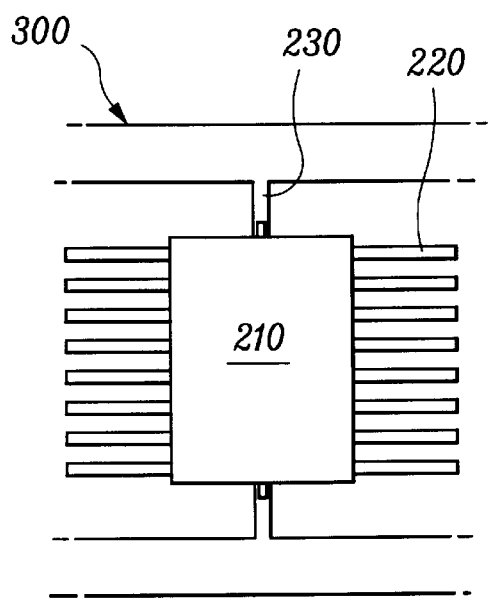
Figure 3C:
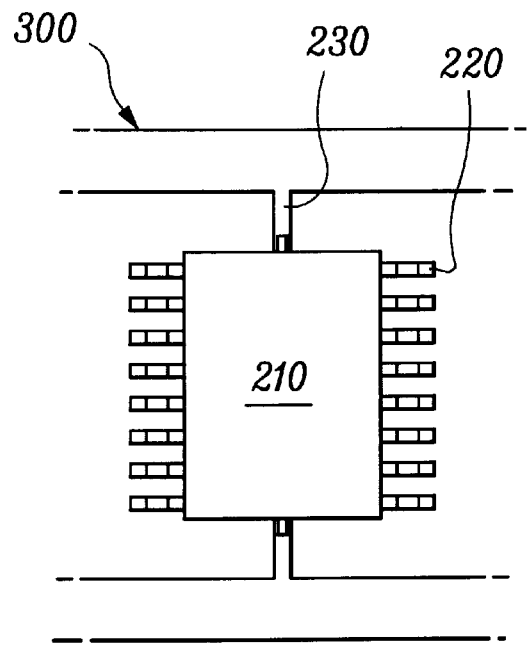
Figure 3D:
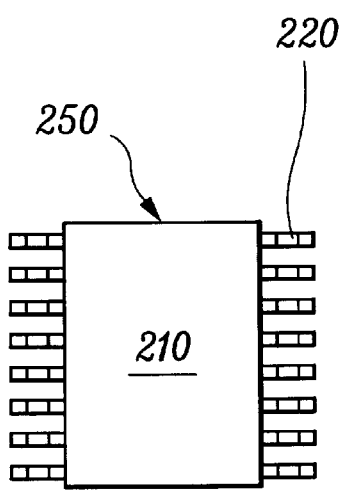
Figure 4A:
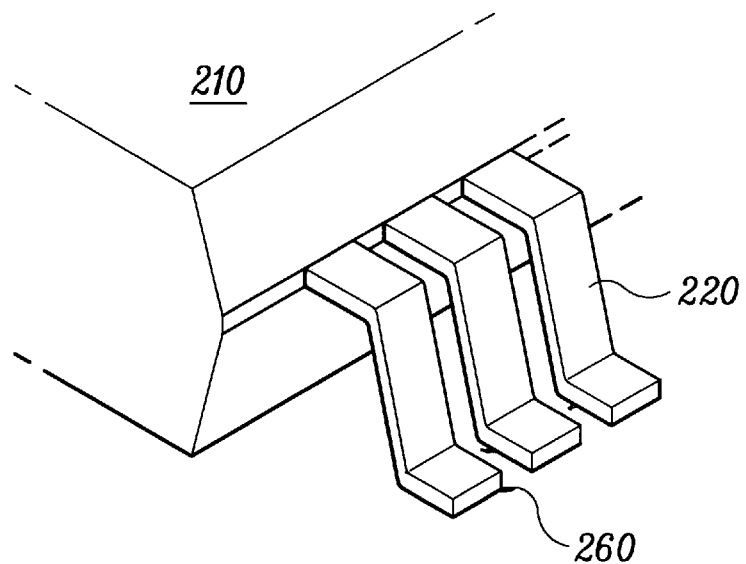
FIGS. 4A and 4B show the package leads bearing tin dust.
Figure 4B:
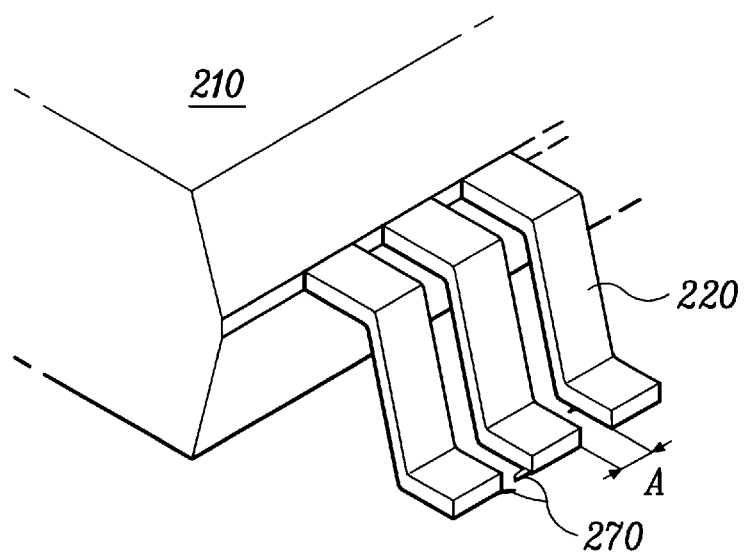
Figure 5:
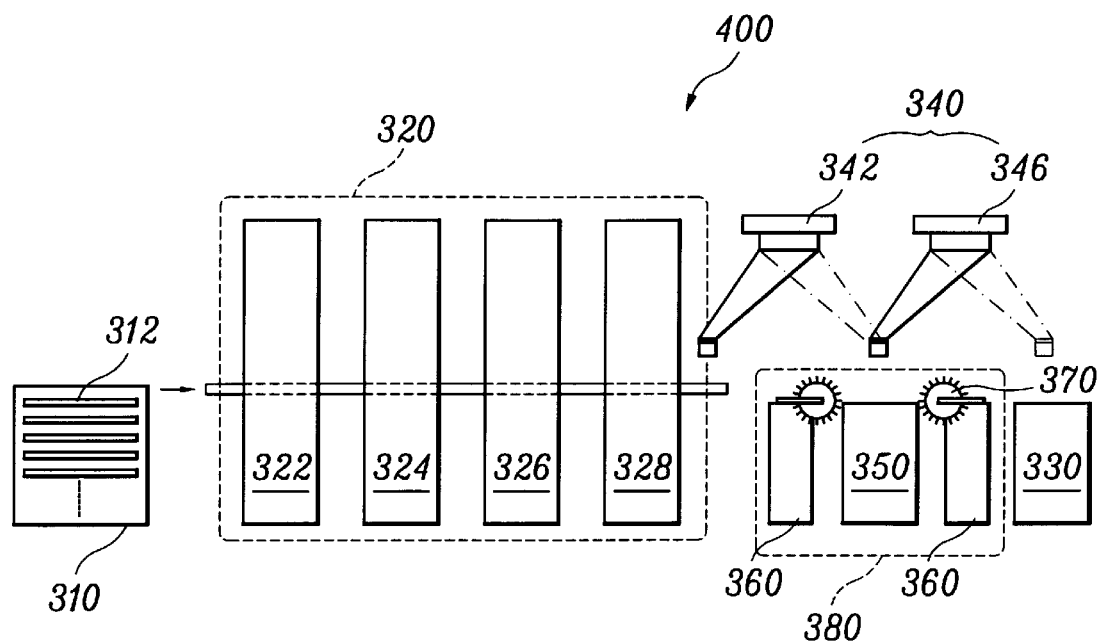
FIG. 5 is a plan view showing a lead forming apparatus according to an embodiment of the invention.

A lead forming apparatus and method in accordance with the present invention will be described with reference to the attached drawings. As shown in FIG. 5, a lead forming apparatus 400 in accordance with an embodiment of the present invention, includes: a lead forming part 320 which forms the outer leads of semiconductor packages and separates the packages from a leadframe 312 having multiple semiconductor packages integrated thereon; a supplier part 310 which supplies lead frame 312 to lead forming part 320; a collection part 330 which collects the separated packages; an intermediate post 350 located between lead forming part 320 and collection part 330; and a package transportation part 340 for transporting packages from lead forming part 320 to collection part 330. Package transportation part 340 further includes a first package transportation part 342 for transporting the separated packages from lead forming part 320 to intermediate post 350, and a second package transportation part 346 for transporting the packages from intermediate post 350 to collection part 330.

Further, lead forming apparatus 400 according to the present invention includes a brush block 380. Brush block 380 includes a pair of brushes 370, each of which is adjacent intermediate post 350, and a pair of brush transportation parts 360. Brushes 370 are preferably made of a nonconductive material.

Figure 6:
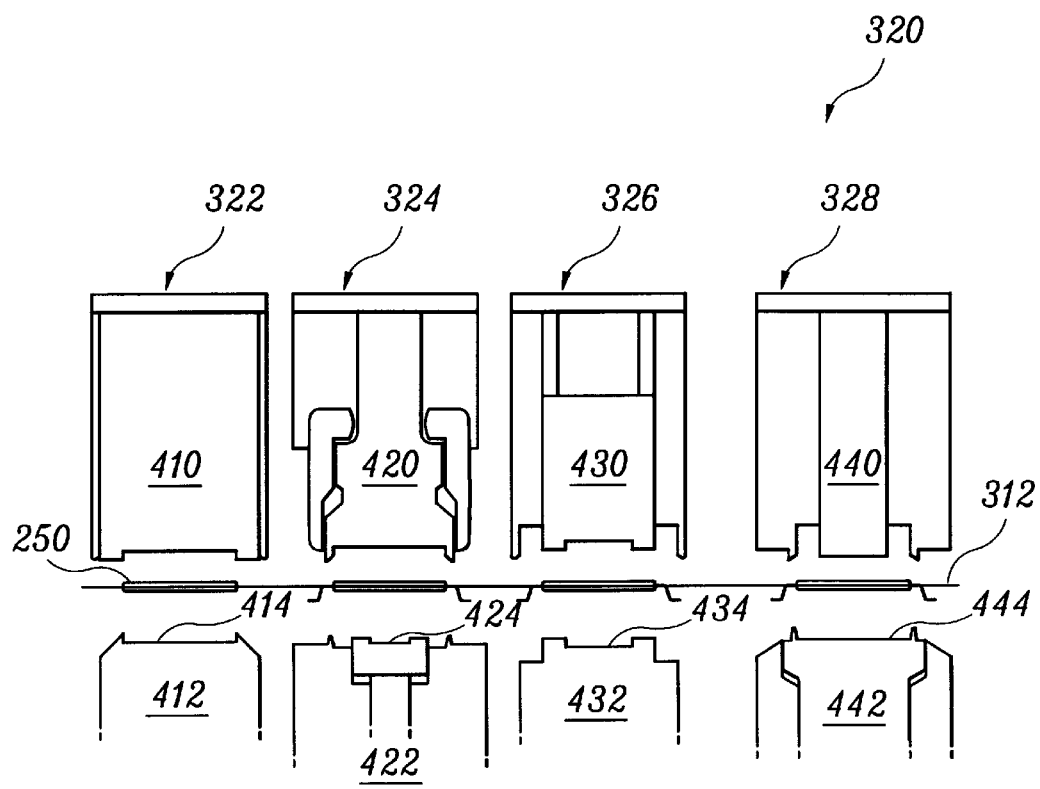
FIG. 6 shows the lead forming part of the lead forming apparatus of FIG. 5.

Lead forming part 320 includes a lead cutting die 322, a lead bending die 324, a lead forming die 326, and a tie-bar cutting die 328, as shown in FIG. 6. Each of dies 322, 324, 326, and 328 has an upper die and a lower die 410 and 412, 420 and 422, 430 and 432, and 440 and 442, respectively, and contains a package 250 within a cavity formed between upper die and lower die 410 and 412, 420 and 422, 430 and 432, and 440 and 442. Top surfaces 414, 424, 434 and 444 of lower dies 412, 422, 432 and 442 are coplanar for simultaneous operation of dies 322, 324, 326 and 328

Figure 7:
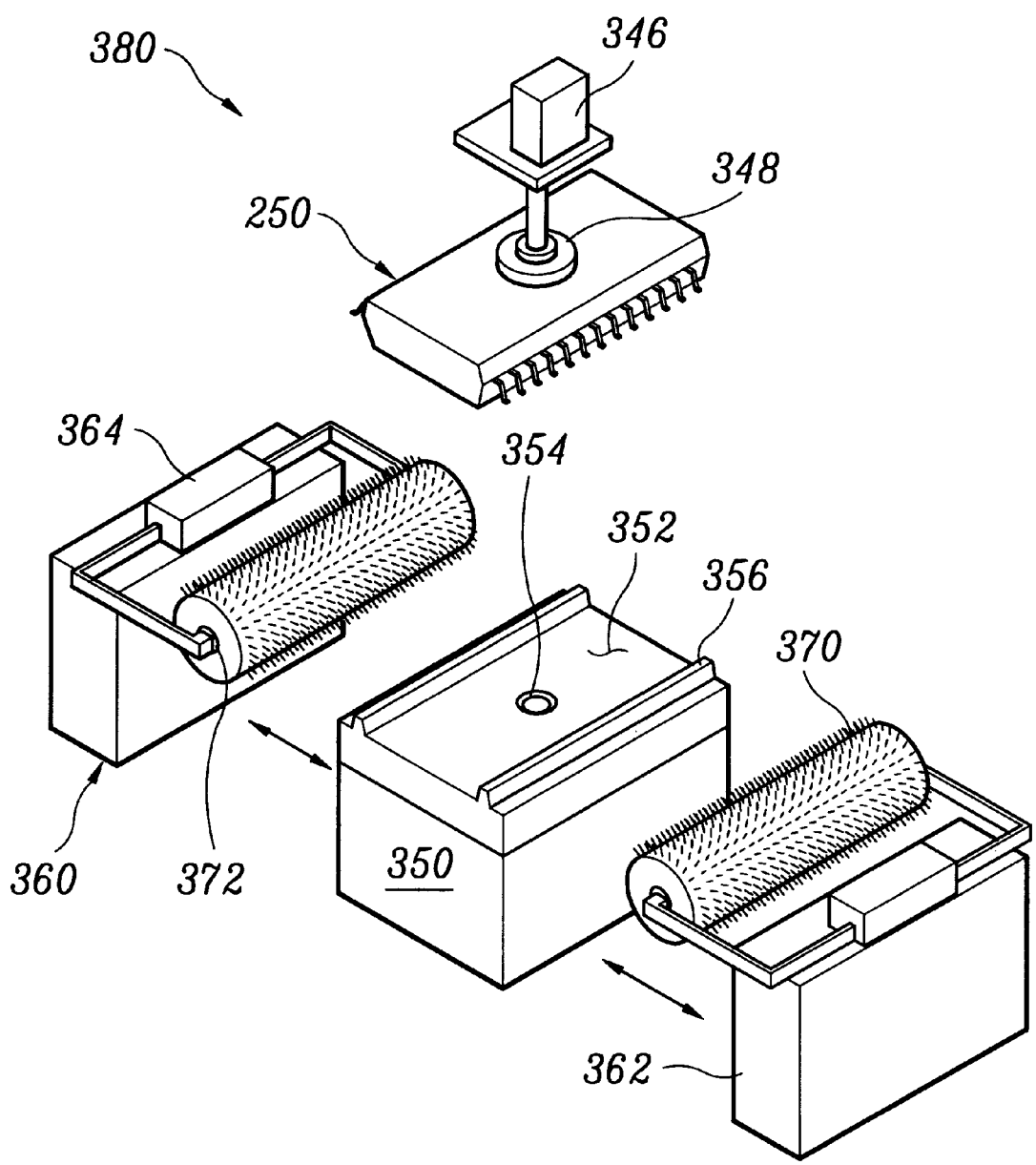
FIG. 7 is a perspective view of a brush block of the lead forming apparatus of FIG. 5.

FIG. 7 shows brush block 380 of apparatus 400 in FIG. 5. Brush block 380 includes a pair of brushes 370 located around intermediate post 350, on which package 250 stays temporarily. A pair of brush transportation parts 360, to which brushes 370 attach, move brushes 370 to and from intermediate post 350. Intermediate post 350 has a suction port 354 which is connected to an external exhauster, such as a vacuum pump, and holds package 250 thereon by differential pressure created through suction port 354. Intermediate post 350 further includes a pair of lead seats 356, on which the outer leads of package 250 sit, to prevent deformation of the outer leads during brushing. Typically, each lead set has a shape that matches a desired shape of the outer leads.

In addition, brush transportation part 360 includes a brush support 364 and a brush transporter 362. Brush support 364 is combined with an axle 372 around which brush 370 rotates by a driving tool (not shown) connected to axle 372. Brush transporter 362 advances and retreats brush 370 to and from intermediate post 350. Brush transporter 362 can slide along a guide rail (not shown) set up on a base (not shown). Alternatively, brush support 364 can move so as to transport brush 370.

Figure 8A:
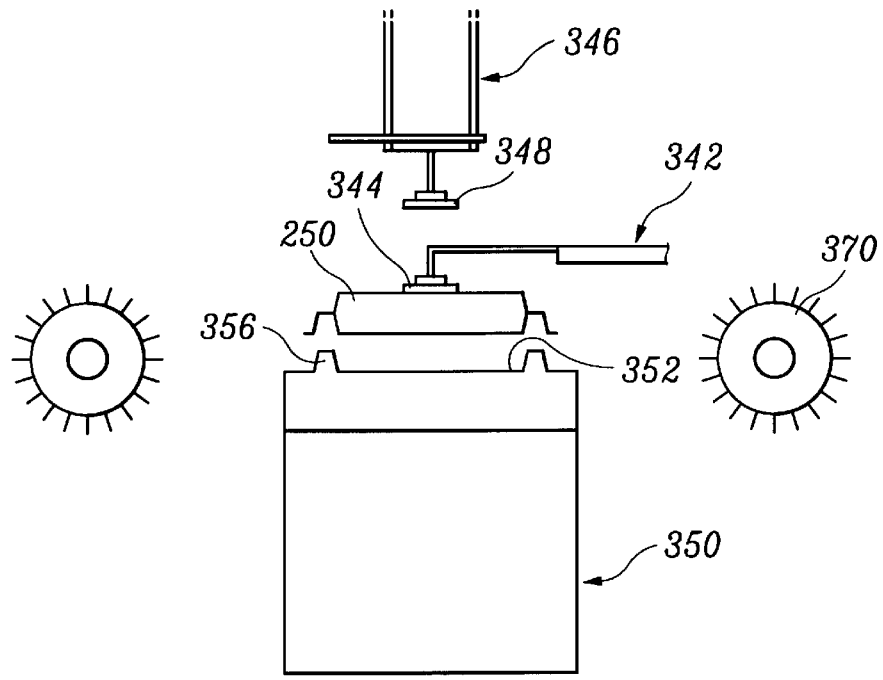
FIGS. 8A to 8F illustrate the operation of the brush block in FIG. 7.
Figure 8B:
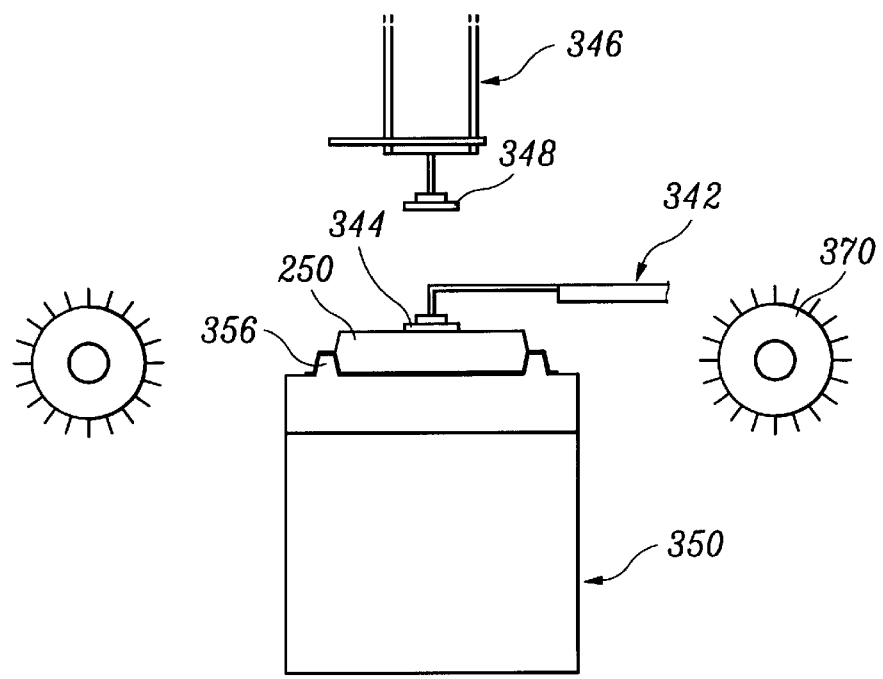
Figure 8C:
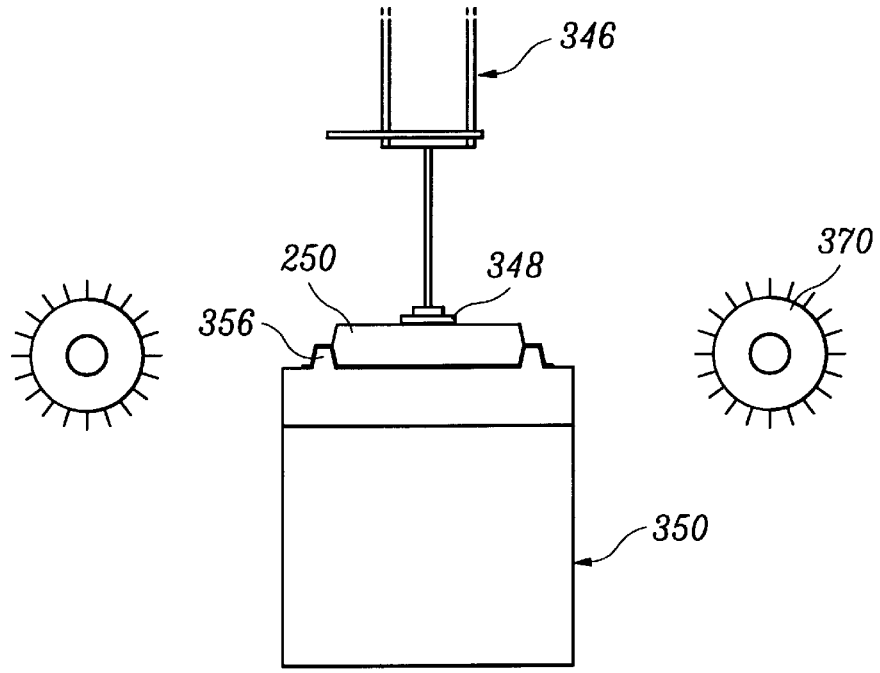
Figure 8D:
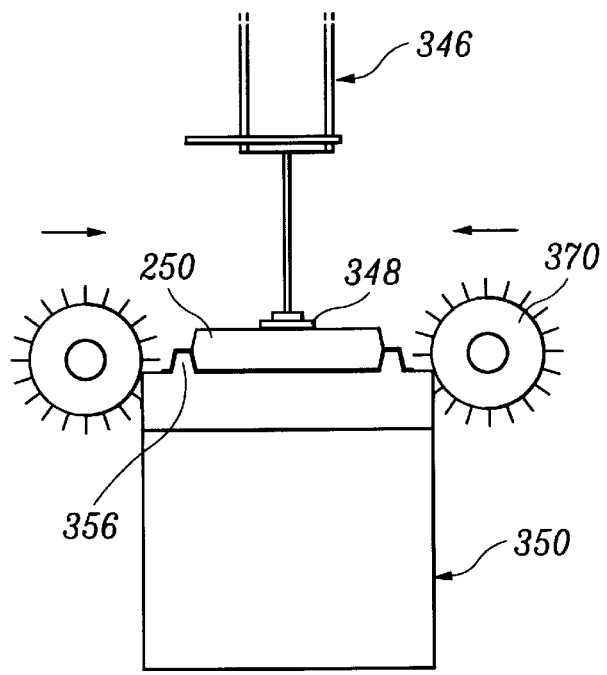
Figure 8E:
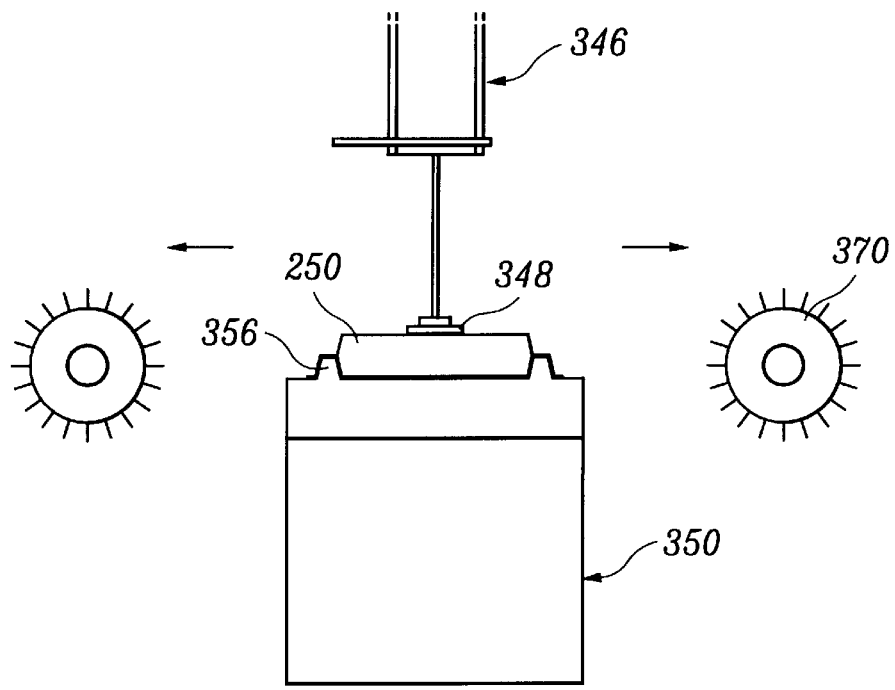
Figure 8F:
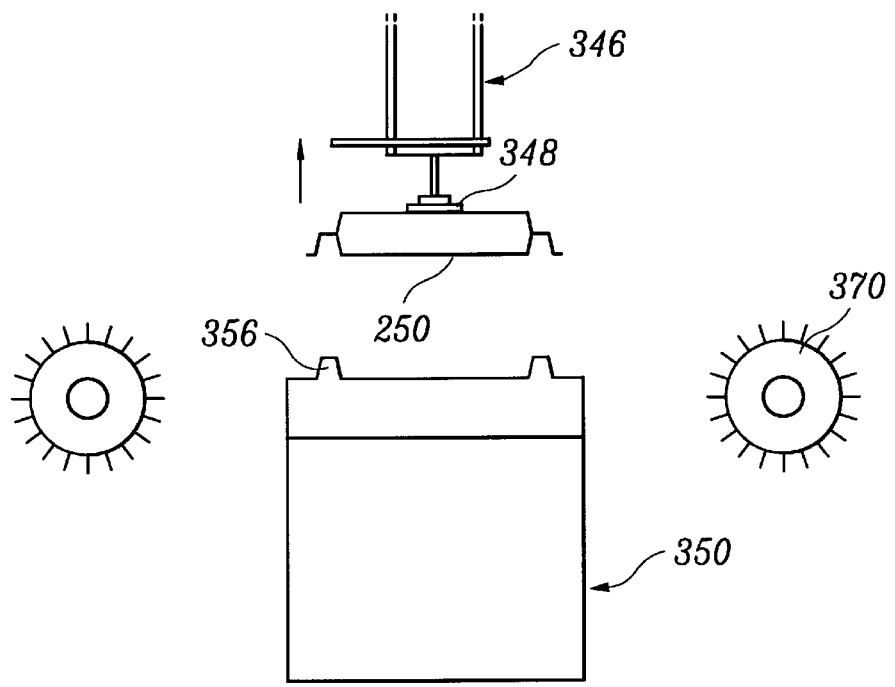

FIGS. 8A to 8F sequentially show how brush block 380 in FIG. 7 operates to remove tin dust on the outer leads of package 250. Initially, a first picker 344 of first package transportation part 342 transports package 250 to intermediate post 350 (FIG. 8A) and lowers package 250 onto post 350 (FIG. 8B). Picker 344 then releases package 250 and moves away. A second picker 348 of second package transportation part 346 moves down and applies a slight pressure to hold package 250 on the top of intermediate post 350 (FIG. 8C). Instead of using second picker 348, suction through suction port 354 of FIG. 7 can hold package 250 on intermediate post 350. Once package 250 is held in place, brushes 370 move to package 250 (FIG. 8D) and revolve to brush tin dust away from the outer leads of package 250. After removing tin dust, brush 370 returns to original position (FIG. 8E), and second picker 348 of second package transportation part 346 picks up package 250 (FIG. 8F) and transports package 250 to collection part 330.

Figure 9:
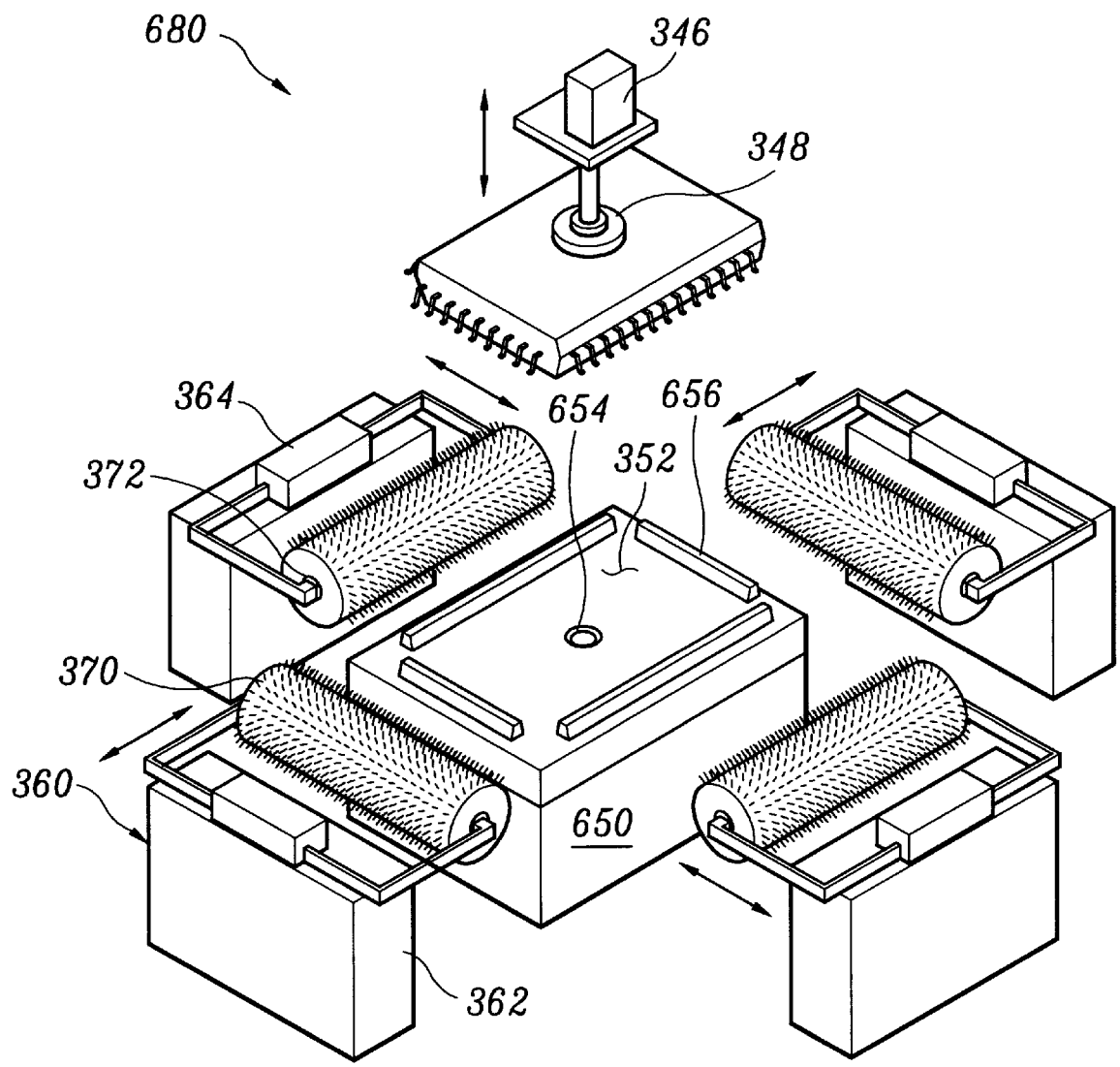
FIG. 9 is a perspective view of another brush block according to the present invention.

FIG. 9 shows an embodiment of a brush block 680 having two pairs of brushes 370. While brush block 380 in FIG. 7 is best suited for a package having outer leads formed on two sides of the package, such as an SOJ (Small Outline J-lead Package) and a TSOP (Thin Small Outline Package), brush block 680 in FIG. 9 is best suited for a package having outer leads formed at four sides of the package, such as a QFP (Quad Flat Package) or a PLCC (Plastic Leaded Chip Carrier). In comparison with brush block 380, brush block 680 of FIG. 9 has a different intermediate post 650, an additional pair of brushes 370 located around the intermediate post 650, and additional brush transportation parts 360 which advance and retreats brushes 370 to and from intermediate post 650.

For holding a package, intermediate post 650 in FIG. 9 has a suction port 654 formed thereon and two pairs of lead seats 656. Suction port 654 is connected to an external exhauster, such as a vacuum pump. Each brush transportation part 360 includes a brush support 364 and a brush transporter 362. Brush support 364 is combined with an axle 372 around which a driving tool (not shown) connected to axle 372 rotates brush 370. Brush transporter 362 advances and retreats brush 370 to and from intermediate post 650. Brush transporter 362 can slide along a guide rail (not shown) set up on a base (not shown). Alternatively, brush support 364 can move to transport brush 370 back and forth.

Figure 10:
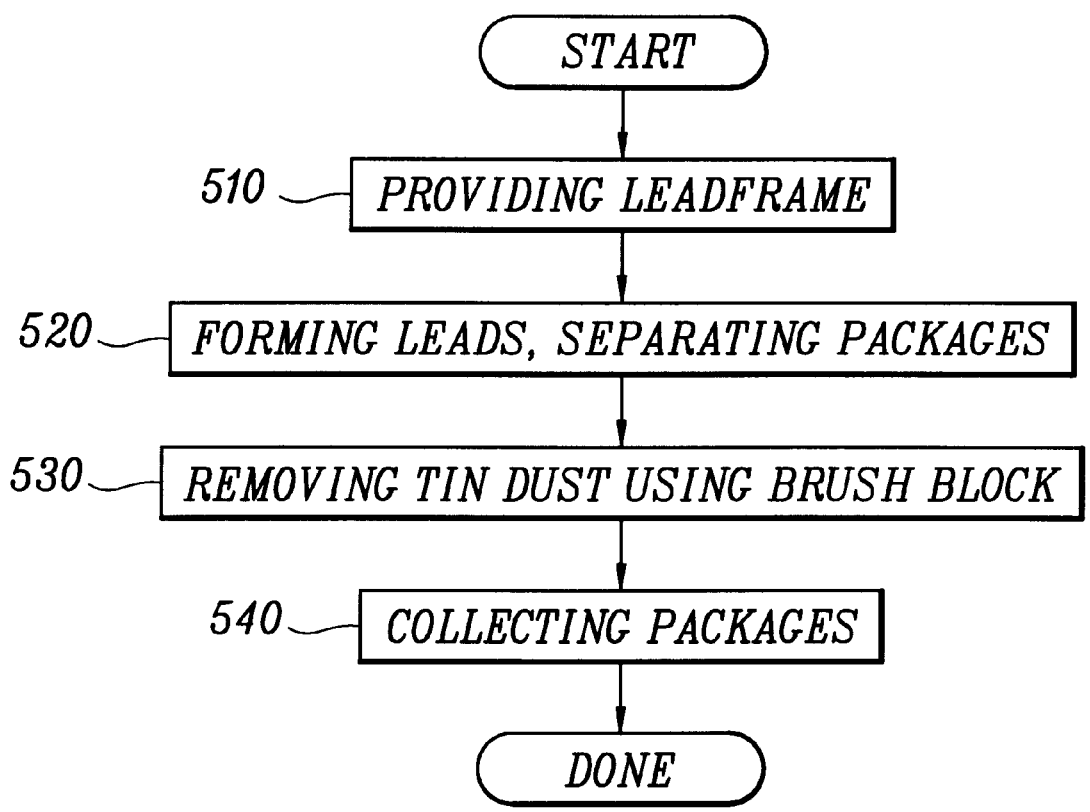
FIG. 10 is a flowchart of a lead forming method according to the present invention.
Figure 11:
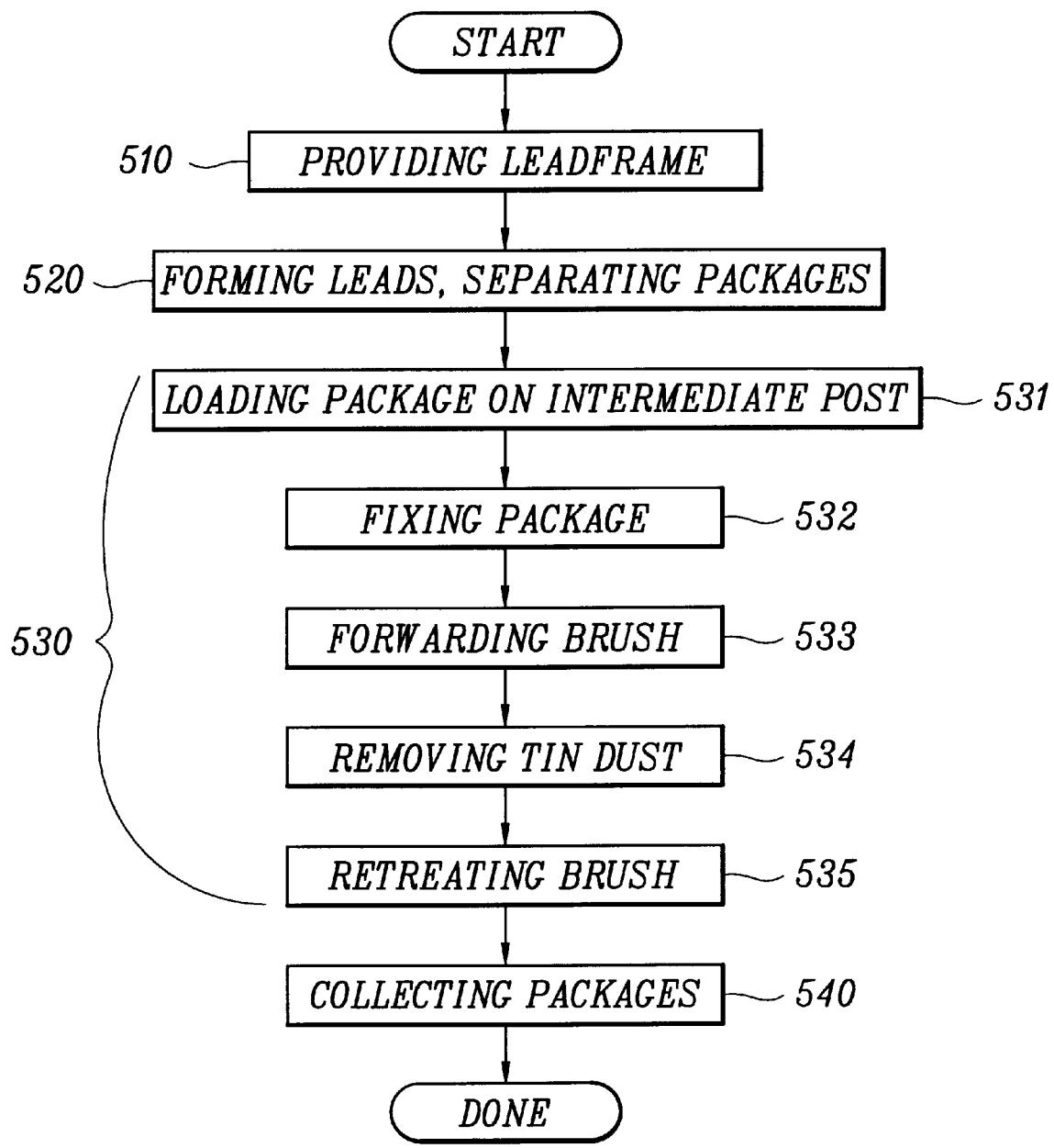
FIG. 11 is a flowchart further illustrating removal of tin dust as in FIG. 10.

FIG. 10 is a flowchart of lead forming method according to the present invention, and FIG. 11 is a flowchart showing the step of removing tin dust in FIG. 10 in detail. A lead forming method according to the present invention includes providing a leadframe having semiconductor packages integrated thereon (510), forming outer leads of the packages and separating the packages from the lead frame (520), removing tin dust from the outer leads of the packages (530), and collecting the packages in a container (540).

Removing tin dust (530) includes transporting the separated package to an intermediate post, loading the package on the intermediate post (531), fixing or holding the package on the intermediate post (532), advancing a brush to the intermediate post (533), removing tin dust from the outer leads by brushing the outer leads of the package (534), and retreating the brush from the intermediate post (535). While this invention has been described with reference to illustrative embodiments, this description is not intended to be construed in a limiting sense. Various modifications and alterations might be made by those skilled in the art without departing from the spirit and scope of the present invention.

What is claimed is:

1. An apparatus for processing packages containing semiconductor devices, comprising:
    a lead forming part that forms outer leads of the packages;
    a collection part for collecting the semiconductor packages;
    an intermediate post located between the lead forming part and the collection part;
    a package transportation part for transporting the package from the lead forming part to the intermediate post and from the intermediate post to the collection part; and
    a brush block that removes tin dust from the outer leads of semiconductor packages when the semiconductor packages are on the intermediate post, the brush block including one or more brushes and one or more brush transportation parts, each of which is connected to a corresponding brush and moves the corresponding brush to and from the intermediate post.

2. An apparatus according to claim 1, wherein a suction port is formed on the intermediate post, wherein the suction port is connected to an external exhauster and suction through the suction port holds a package on the intermediate post.

3. An apparatus according to claim 2, wherein the exhauster is a vacuum pump.

4. An apparatus according to claim 1, wherein the package transportation part comprises:
    a first package transportation part for transporting packages from the lead forming part to the intermediate post; and
    a second package transportation part for transporting the semiconductor package from the intermediate post to the collection part,
    wherein the first package transportation part comprises a first package picker, and the second package transportation part comprises a second package picker.

5. An apparatus according to claim 4, wherein the second package picker presses a package to hold the package on the intermediate post while the brushes remove tin dust from the outer leads of the package.

6. An apparatus according to claim 1, wherein the brush is made of a nonconductive material.

7. An apparatus according to claim 1, wherein the brushes revolve to remove tin dust from the outer leads of the packages.

8. An apparatus according to claim 1, wherein the brushes comprise a pair of brushes on opposite sides of the intermediate post.

9. An apparatus according to claim 1, wherein the brushes comprise two pairs of brushes confronting to one another.

10. An apparatus according to claim 1, wherein each brush transportation part comprises:
    a brush support for supporting the corresponding brush; and
    a brush transporter that moves the corresponding brush to and from the intermediate post.

11. An apparatus according to claim 1, further comprising a supplier part for providing semiconductor packages integrated with a leadframe, wherein the lead forming part separates the packages of the leadframe.

12. An apparatus according to claim 11, wherein the lead forming part comprises:
    lead cutting dies for separating the outer leads from the leadframe,
    lead bending dies for bending the separated outer leads,
    lead forming dies for forming the bent outer leads to a desired shape, and
    tie-bar cutting dies for separating the packages from the leadframe.

13. An apparatus according to claim 12, wherein each of the dies includes an upper die and a lower die.

14. An apparatus according to claim 13, wherein each of the lower dies has on a top side a space for accepting a package, the spaces keeping packages aligned for simultaneous operation of the dies.

15. An apparatus according to claim 1, wherein the intermediate post comprises one or more lead seats, on which the outer leads of the semiconductor package sit, for preventing deformation of the outer leads during brushing.

16. A method for forming outer leads of a package, the method comprising:
    bending and forming the outer leads of the package for a semiconductor device;
    transporting the package to a post;
    using a brush block to remove tin dust from the outer leads of the package while the package is on the post, wherein removing the tin dust comprises:
        holding the semiconductor package on the intermediate post;
        advancing one or more brushes to the intermediate post by a brush transportation part;
        removing tin dust from the outer leads by the brushes; and
        retreating the brushes from the intermediate post by the brush transportation part; and
    collecting the package with other semiconductor packages in a container.

17. A lead forming method according to claim 16, further comprising providing semiconductor packages integrated with a leadframe wherein bending and forming the outer leads comprises separating the package from the leadframe.

18. A lead forming method according to claim 17, further comprising repeating the steps of claim 16 for each of the semiconductor packages integrated with the leadframe.

19. A lead forming method according to claim 16, wherein holding the package on the post comprises applying suction through a suction port formed on the post.

* * * * *